(12) United States Patent
Lv et al.

(10) Patent No.: US 10,386,663 B2
(45) Date of Patent: Aug. 20, 2019

(54) GOA CIRCUIT AND LIQUID CRYSTAL DISPLAY DEVICE

(71) Applicant: Shenzhen China Star Optoelectronics Semiconductor Display Technology Co., Ltd., Shenzhen (CN)

(72) Inventors: Xiaowen Lv, Shenzhen (CN); Shujhih Chen, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 36 days.

(21) Appl. No.: 15/574,832

(22) PCT Filed: Sep. 15, 2017

(86) PCT No.: PCT/CN2017/101974
§ 371 (c)(1),
(2) Date: Nov. 16, 2017

(87) PCT Pub. No.: WO2019/033492
PCT Pub. Date: Feb. 21, 2019

(65) Prior Publication Data
US 2019/0049768 A1    Feb. 14, 2019

(30) Foreign Application Priority Data

Aug. 14, 2017   (CN) .......................... 2017 1 0694031

(51) Int. Cl.
*G02F 1/133*    (2006.01)
*H01L 27/12*    (2006.01)
(Continued)

(52) U.S. Cl.
CPC ........ *G02F 1/13306* (2013.01); *G02F 1/1343* (2013.01); *G09G 3/36* (2013.01);
(Continued)

(58) Field of Classification Search
CPC ..... G02F 1/13306; G02F 1/1343; G09G 3/36; H01L 27/1214
(Continued)

(56) References Cited

U.S. PATENT DOCUMENTS

2009/0304138 A1\* 12/2009 Tsai ........................ G11C 19/28
377/79
2011/0234577 A1\* 9/2011 Yang .................... G09G 3/3677
345/212

(Continued)

FOREIGN PATENT DOCUMENTS

CN    103680386 A    3/2014
CN    104464665 A    3/2015
(Continued)

*Primary Examiner* — Prabodh M Dharia
(74) *Attorney, Agent, or Firm* — Leong C. Lei

(57) ABSTRACT

A GOA circuit includes a plurality of cascaded GOA units. An N-th stage GOA unit controls charging of an N-th horizontal scanning line. The N-th stage GOA unit includes a pull-high control unit, a pull-high unit, a pull-down unit, a pull-down sustain unit, and a boast capacitor (Cb). The pull-high unit, the pull-down sustain unit and the boast capacitor (Cb) are connected with a first node (Q(N)) and a gate signal output terminal (G(N)) of the N-th stage GOA unit. The pull-high control unit and the pull-down unit are connected with the first node (Q(N)) of the N-th stage GOA unit. The pull-down sustain unit includes a first TFT (T61), a second TFT (T62), a third TFT (T64), a fourth TFT (T43), and a fifth TFT (T33). Also provided is a liquid crystal display device using the GOA circuit.

10 Claims, 3 Drawing Sheets

(51) Int. Cl.
*G02F 1/1343* (2006.01)
*G09G 3/36* (2006.01)

(52) U.S. Cl.
CPC ....... *G09G 3/3677* (2013.01); *H01L 27/1214* (2013.01); *G09G 2310/0286* (2013.01)

(58) Field of Classification Search
USPC .................. 345/87, 92, 204–214; 377/79
See application file for complete search history.

(56) References Cited

U.S. PATENT DOCUMENTS

| | | | | |
|---|---|---|---|---|
| 2015/0187302 A1* | 7/2015 | Dai | ................. | G09G 3/006 345/92 |
| 2015/0187312 A1* | 7/2015 | Dai | ................. | G09G 3/3648 345/213 |
| 2015/0279289 A1* | 10/2015 | Yu | ................. | G11C 19/28 345/690 |
| 2016/0055815 A1* | 2/2016 | Dai | ................. | G09G 3/3648 345/213 |
| 2016/0140922 A1* | 5/2016 | Dai | ................. | G11C 19/287 345/92 |
| 2016/0189648 A1* | 6/2016 | Xiao | ................. | G09G 3/3677 345/212 |
| 2016/0189649 A1* | 6/2016 | Xiao | ................. | G11C 19/28 345/214 |
| 2016/0275886 A1* | 9/2016 | Dai | ................. | G11C 19/28 |
| 2016/0275887 A1* | 9/2016 | Xiao | ................. | G09G 3/3648 |
| 2018/0190228 A1* | 7/2018 | Xu | ................. | G09G 3/3677 |
| 2018/0211626 A1* | 7/2018 | Shi | ................. | G09G 3/3677 |
| 2018/0211627 A1* | 7/2018 | Shi | ................. | G09G 3/3677 |
| 2019/0051263 A1* | 2/2019 | Wang | ................. | G09G 3/3677 |

FOREIGN PATENT DOCUMENTS

| | | |
|---|---|---|
| CN | 105304041 A | 2/2016 |
| CN | 106128397 A | 11/2016 |
| CN | 106448590 A | 2/2017 |
| KR | 20050104895 A | 11/2005 |

* cited by examiner

GOA CIRCUIT AND LIQUID CRYSTAL DISPLAY DEVICE

BACKGROUND OF THE INVENTION

Field of Invention

The present invention relates to the field of liquid crystal display, and more particularly to a GOA circuit and a liquid crystal display device.

Description of Prior Art

Liquid crystal displays (LCDs) such as flat panel display devices are widely used in mobile phones, televisions, personal digital assistants, digital cameras, notebooks, desktop, other consumer electronics products and etc. for high quality, power saving, thin body and wide application range. The LCDs has become the mainstream in display device.

In the active LCD, each sub-pixel has a thin film transistor (TFT) whose gate electrode is connected with a horizontal scanning line, a drain electrode is connected with a data line in the vertical direction, and a source electrode is connected with a pixel electrode. Applying a sufficient voltage on the horizontal scanning line, all the TFTs on the horizontal scanning line are opened, where the pixel electrodes on the horizontal scanning line will be conducted with the data lines in the vertical direction, the display-signal voltage on the data line is written onto the pixels, to control the transparency of different liquid crystal for achieving the effect of color control. At present, the driving of the horizontal scanning line of the active LCD panel is mainly realized by an external chip (IC) of the panel. The external IC can control the charging and discharging of each stage horizontal scanning line from stage to stage. GOA technology, the gate driver on array technology, which use the conventional process of the LCD panel to produce the driving circuit of the horizontal scanning line on the substrate around the display area so that it can replace the external IC to complete the driving of the horizontal scanning lines.

The conventional GOA circuits typically include cascaded multiple GOA units, each stage GOA unit corresponds to drive a horizontal scanning line. The main structure of the GOA unit includes a pull-high unit, a pull-high control unit, a pull-down unit, a pull-down sustain unit, and a boast capacitor for the potential elevation. The pull-high unit is mainly responsible for outputting the clock signal as a gate signal. The pull-high control unit is responsible for controlling the opening time of the pull-high unit. Generally, the pull-high control unit is connected with a previous stage GOA circuit to receive a stage-transfer signal or the gate signal. The pull-down unit is responsible for pulling the gate signal low to a low potential at the first moment, that is, the gate signal is turned off. The pull-down sustain unit is responsible for maintaining the gate output signal and the gate signal of the pull-high unit (commonly referred to as Q point) in a closed state (i.e., negative potential). The boast capacitor is responsible for a second potential elevation of the Q point, which is beneficial to the output G(N) of the pull-high unit.

With the improvement of TFT performance, GOA technology has been widely used in LCD panels; GOA technology has many advantages, such as saving line drive chip, improving customer yield, and achieving borderless design. At present, the conventional GOA circuit structure is shown in FIG. 1, the GOA circuit structure is mainly constituted by the pull-high control unit T11, the pull-high unit (including T21, T22), the pull-down unit T41, the pull-down sustain unit (including T61/T62/T63/T64, T33, T43), and a boast capacitor Cb and so on. FIG. 2 shows a waveform illustrative diagram of the input signal and the node of the conventional GOA circuit architecture. In FIG. 2, CK and XCK represent the waveform of the clock signal inputted to the GOA unit. The XCK and CK phases are opposite, and VSS represents the waveform of a constant low voltage connected with the GOA unit, ST (N−1) and ST (N) respectively represent the waveforms of stage-transfer signals of corresponding GOA units, G(N−1), G(N), and G(N+1) respectively represent the waveforms of the row scanning signal of the gate signal output terminals of corresponding GOA units, and Q (N) and P (N) respectively represent the waveforms of node Q and node P of the corresponding GOA units.

FIG. 1 shows merely ordinary circuit architecture according to the conventional art. FIG. 2 shows a waveform of the input signal and the nodes suitable for this circuit architecture. The circuit operation can be understood in conjunction with FIG. 2. To the N-th stage GOA unit, the pull-high control unit is connected with a stage-transfer signal output terminal ST(N−4) and a gate signal output terminal G (N−4) of a (N−4)th stage GOA unit. The pull-high unit is connected with a clock signal CK and a stage-transfer signal output terminal ST(N) of the (N)th stage GOA unit, and is responsible for outputting the clock signal CK to corresponding horizontal scanning lines through a gate signal output terminal G(N) of the N-th stage and outputting the stage-transfer signal of the N-th stage GOA unit. The pull-down unit T41 is responsible for pulling down the gate signal output terminal G(N) of the N-th stage. The low-frequency clock signal LC2 and the constant-low-voltage signal VSS1 are inputted to the pull-down sustaining unit, and the low-frequency clock signal LC2 may be a constant-high-voltage signal, the waveform of the constant-low-voltage signal VSS1 may be represented as VSS in FIG. 2. The pull-down sustain unit may be used to keep to pull down the voltage of the gate signal output terminal G(N) and the voltage of the node Q (N) of the pull-high unit, so that the gate signal outputted from the gate signal output terminal G (N) is maintained in the OFF state. The main component of the pull-down unit is an inverter 100. The most commonly used is the Darlington structure in FIG. 1. However, the Darlington structure requires more TFTs and is not economically economical.

SUMMARY OF THE INVENTION

Therefore, an object of the present invention is to provide a GOA circuit that improves the GOA circuit design and reduces the number of TFTs.

Another object of the present invention is to provide a liquid crystal display device that improves the GOA circuit design and reduces the number of TFTs.

In order to achieve the object, the present invention provides a GOA circuit, which comprises a plurality of cascaded GOA units. An N-th stage GOA unit controls charging of an N-th horizontal scanning line. The N-th stage GOA unit comprises a pull-high control unit, a pull-high unit, a pull-down unit, a pull-down sustain unit, and a boast capacitor. The pull-high unit, the pull-down sustain unit and the boast capacitor are respectively connected with a first node and a gate signal output terminal of the N-th stage GOA unit. The pull-high control unit and the pull-down unit are respectively connected with the first node of the N-th stage GOA unit. The pull-down sustain unit comprises:

A first thin film transistor. A gate electrode of first thin film transistor is inputted with a low frequency clock signal. A source electrode and a drain electrode of first thin film transistor are respectively connected with a second node of the N-th stage GOA unit and inputted with the low frequency clock signal.

A second thin film transistor. A gate electrode of the second thin film transistor is connected with the first node of the N-th stage GOA unit. A source electrode and a drain electrode of the second thin film transistor are respectively connected with the second node of the N-th stage GOA unit and inputted with a constant-low-voltage signal.

A third thin film transistor. A gate electrode of the third thin film transistor is connected with a stage-transfer signal output terminal of the N-th stage GOA unit. A source electrode and a drain electrode of the third thin film transistor are respectively connected with the second node of the N-th stage GOA unit and inputted with the constant-low-voltage signal.

A fourth thin film transistor. A gate of the fourth thin film transistor is connected with the second node of the N-th stage GOA unit. A source electrode and a drain electrode of the fourth thin film transistor are respectively connected with the first node of the N-th stage GOA unit and inputted with the constant-low-voltage signal.

A fifth thin film transistor. A gate electrode of the fifth thin film transistor is connected with the second node of the N-th stage GOA unit. A source electrode and a drain electrode of the fifth thin film transistor are respectively connected with the gate signal output terminal of the N-th stage GOA unit and inputted with the constant-low-voltage signal.

Wherein the pull-high control unit comprises a sixth thin film transistor. A gate of the sixth thin film transistor is connected with a stage-transfer signal output terminal of the (N−m)th stage GOA unit. A source electrode and a drain electrode of the sixth thin film transistor are respectively connected with the first node of the N-th stage GOA unit and a gate signal output terminal of the (N−m)th stage GOA unit, and m is a natural number.

Wherein the gate of the sixth thin film transistor is connected with a stage-transfer output terminal of the (N−4)th stage GOA unit. The source electrode and the drain electrode of the sixth thin film transistor are respectively connected with the first node of the N-th stage GOA unit and a gate signal output terminal of the (N−4)th stage GOA unit.

Wherein the pull-high unit comprises:

A seventh thin film transistor. A gate electrode of the seventh thin film transistor is connected with the first node of the N-th stage GOA unit. A source electrode and a drain electrode of the seventh thin film transistor are respectively connected with the gate signal output terminal of the N-th stage GOA unit and inputted with a clock signal.

An eighth thin film transistor. A gate electrode of the eighth thin film transistor is connected with the first node of the N-th stage GOA unit. A source electrode and a drain electrode of the eighth thin film transistor are respectively connected with the stage-transfer signal output terminal of the N-th stage GOA unit and inputted with the clock signal.

Wherein the pull-high unit comprises a ninth thin film transistor. A gate of the ninth thin film transistor is connected with a gate signal output terminal of the (N+m)th stage GOA unit. A source electrode and a drain electrode of the ninth thin film transistor are respectively connected with the first node of the N-th stage GOA unit and the constant-low-voltage signal.

Wherein the gate of the ninth thin film transistor is connected with a gate signal output terminal of the (N+4)th stage GOA unit. The source electrode and the drain electrode of the ninth thin film transistor are respectively connected with the first node of the N-th stage GOA unit and the constant-low-voltage signal.

Wherein the low frequency clock signal is a constant-high-voltage signal.

The present invention further provides a liquid crystal display device, which comprises the GOA circuit mentioned above.

The present invention further provides a GOA circuit, which comprises a plurality of cascaded GOA units. An N-th stage GOA unit controls charging of an N-th horizontal scanning line. The N-th stage GOA unit comprises a pull-high control unit, a pull-high unit, a pull-down unit, a pull-down sustain unit, and a boast capacitor. The pull-high unit, the pull-down sustain unit and the boast capacitor are respectively connected with a first node and a gate signal output terminal of the N-th stage GOA unit. The pull-high control unit and the pull-down unit are respectively connected with the first node of the N-th stage GOA unit. The pull-down sustain unit comprises:

A first thin film transistor. A gate electrode of first thin film transistor is inputted with a low frequency clock signal. A source electrode and a drain electrode of first thin film transistor are respectively connected with a second node of the N-th stage GOA unit and inputted with the low frequency clock signal.

A second thin film transistor. A gate electrode of the second thin film transistor is connected with the first node of the N-th stage GOA unit. A source electrode and a drain electrode of the second thin film transistor are respectively connected with the second node of the N-th stage GOA unit and inputted with a constant-low-voltage signal.

A third thin film transistor. A gate electrode of the third thin film transistor is connected with a stage-transfer signal output terminal of the N-th stage GOA unit. A source electrode and a drain electrode of the third thin film transistor are respectively connected with the second node of the N-th stage GOA unit and inputted with the constant-low-voltage signal.

A fourth thin film transistor. A gate of the fourth thin film transistor is connected with the second node of the N-th stage GOA unit. A source electrode and a drain electrode of the fourth thin film transistor are respectively connected with the first node of the N-th stage GOA unit and inputted with the constant-low-voltage signal.

A fifth thin film transistor. A gate electrode of the fifth thin film transistor is connected with the second node of the N-th stage GOA unit. A source electrode and a drain electrode of the fifth thin film transistor are respectively connected with the gate signal output terminal of the N-th stage GOA unit and inputted with the constant-low-voltage signal.

Wherein the pull-high control unit comprises a sixth thin film transistor. A gate of the sixth thin film transistor is connected with a stage-transfer signal output terminal of the (N−m)th stage GOA unit. A source electrode and a drain electrode of the sixth thin film transistor are respectively connected with the first node of the N-th stage GOA unit and a gate signal output terminal of the (N−m)th stage GOA unit, and m is a natural number.

Wherein the pull-high unit comprises:

A seventh thin film transistor. A gate electrode of the seventh thin film transistor is connected with the first node of the N-th stage GOA unit. A source electrode and a drain electrode of the seventh thin film transistor are respectively connected with the gate signal output terminal of the N-th stage GOA unit and inputted with a clock signal.

An eighth thin film transistor. A gate electrode of the eighth thin film transistor is connected with the first node of the N-th stage GOA unit. A source electrode and a drain electrode of the eighth thin film transistor are respectively connected with the stage-transfer signal output terminal of the N-th stage GOA unit and inputted with the clock signal.

Wherein the pull-high unit comprises a ninth thin film transistor. A gate of the ninth thin film transistor is connected with a gate signal output terminal of the (N+m)th stage GOA unit. A source electrode and a drain electrode of the ninth thin film transistor are respectively connected with the first node of the N-th stage GOA unit and the constant-low-voltage signal.

Wherein the low frequency clock signal is a constant-high-voltage signal.

In summary, the GOA circuit and the liquid crystal display device of the present invention reduce the number of TFTs and the layout space, which are beneficial for the GOA product narrow frame design.

BRIEF DESCRIPTION OF THE DRAWINGS

For better understanding the technical proposals and other beneficial effects of the present invention, please refer the following detailed description of the present invention with the accompanying drawings.

In drawings.

DETAILED DESCRIPTION OF THE PREFERRED EMBODIMENTS

Figure 1:
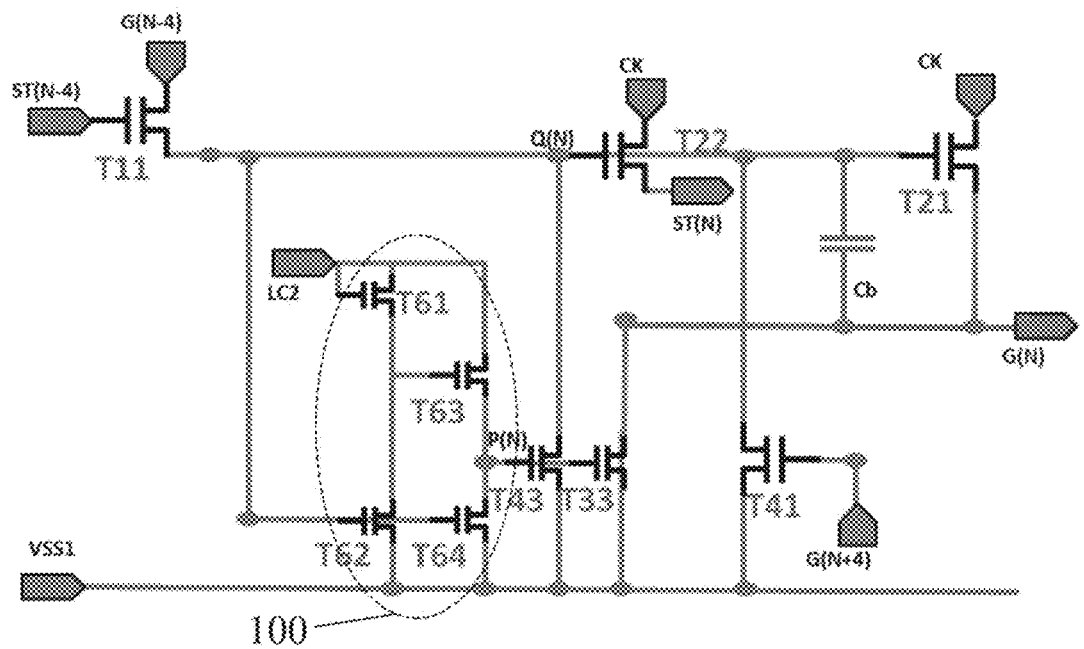
FIG. 1 is an illustrative diagram of an ordinary GOA circuit structure according to the conventional art.
Figure 2:
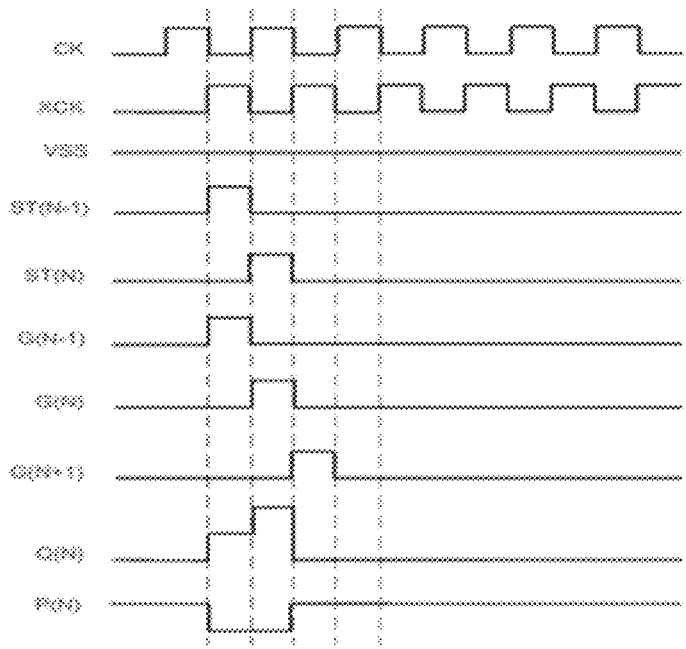
FIG. 2 is an illustrative diagram of waveforms of the input signal and the nodes suitable of the circuit structure according to the conventional art.
Figure 3:
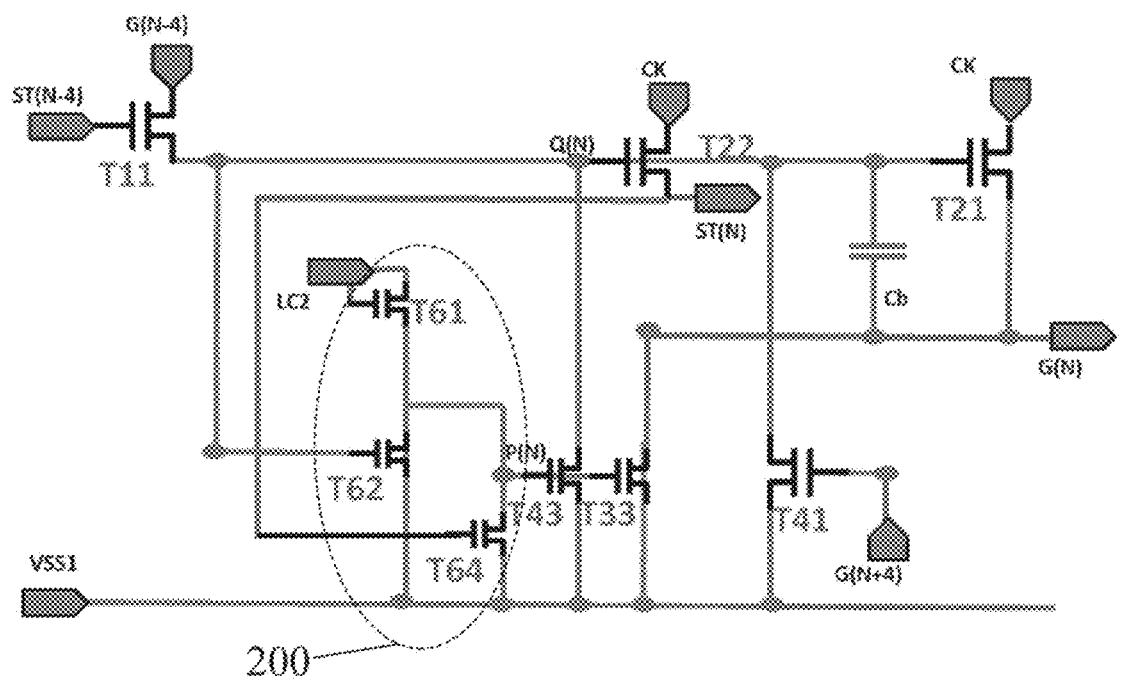
FIG. 3 is an illustrative diagram of a GOA circuit structure according to one preferred embodiment of the present invention.

Please refer to FIG. 3, which is an illustrative diagram of a GOA circuit structure of a preferred embodiment according to the present invention.

A GOA circuit of the present invention comprises a plurality of cascaded GOA units. An N-th stage GOA unit controls charging of an N-th horizontal scanning line, as shown in FIG. 3. The N-th stage GOA unit comprises a pull-high control unit, a pull-high unit, a pull-down unit, a pull-down sustain unit, and a boast capacitor Cb. The pull-high unit, the pull-down sustain unit and the boast capacitor Cb are respectively connected with a node Q(N) and a gate signal output terminal G(N) of the N-th stage GOA unit. The pull-high control unit and the pull-down unit are respectively connected with the node Q(N) of the N-th stage GOA unit.

The pull-down sustain unit comprises: A thin film transistor T61. A gate electrode of thin film transistor T61 is inputted with a low frequency clock signal LC2. A source electrode and a drain electrode of thin film transistor T61 are respectively connected with a node P(N) of the N-th stage GOA unit and inputted with the low frequency clock signal LC2. A thin film transistor T62. A gate electrode of thin film transistor T62 is connected with the node Q(N) of the N-th stage GOA unit. A source electrode and a drain electrode of the thin film transistor T62 are respectively connected with the node P(N) of the N-th stage GOA unit and inputted with a constant-low-voltage signal VSS1. A thin film transistor T64. A gate electrode of the thin film transistor T64 is connected with a stage-transfer signal output terminal ST(N) of the N-th stage GOA unit. A source electrode and a drain electrode of the thin film transistor T64 are respectively connected with the node P(N) of the N-th stage GOA unit and inputted with the constant-low-voltage signal VSS1. A thin film transistor T43. A gate of the thin film transistor T43 is connected with the node P(N) of the N-th stage GOA unit. A source electrode and a drain electrode of the thin film transistor T43 are respectively connected with the node Q(N) of the N-th stage GOA unit and inputted with the constant-low-voltage signal VSS1. The low frequency clock signal LC2 is a constant-high-voltage signal.

The invention improves the GOA circuit design and invents a new inverter structure, which can reduce the number of TFTs needed by the inverter without affecting the inversion effect. Compared with the conventional art, T63 is removed from the inverter 200 of the present invention, and the gate of the T64 is connected to ST (N), which reduces the TFT in the inverter without affecting the G (N) output. When the ST (N) pulls down, the point P (N) can be pulled further to the low potential, reducing the point Q (N) leakage, does not affect the output of G (N), while saving TFT and reducing the layout space, which are beneficial for the GOA product narrow frame design. Compared with the conventional art, the invention has the advantages that the inverter 200 has the same effect as the conventional art. Therefore, the clock signal at the operation period of the GOA circuit of the invention can also adapt for the scheme of the conventional art.

In a preferred embodiment, the pull-high control unit comprises a thin film transistor T11. A gate of the thin film transistor T11 is connected with a stage-transfer signal output terminal ST(N−4) of the (N−4)th stage GOA unit. A source electrode and a drain electrode of the thin film transistor T11 are respectively connected with the node Q(N) of the N-th stage GOA unit and a gate signal output terminal G(N−4) of the (N−4)th stage GOA unit. The pull-high unit comprises: A thin film transistor T21. A gate electrode of the thin film transistor T21 is connected with the node Q(N) of the N-th stage GOA unit. A source electrode and a drain electrode of the thin film transistor T21 are respectively connected with the gate signal output terminal G(N) of the N-th stage GOA unit and inputted with a clock signal CK. A thin film transistor T22. A gate electrode of the thin film transistor T22 is connected with the node Q(N) of the N-th stage GOA unit. A source electrode and a drain electrode of the thin film transistor T22 are respectively connected with the stage-transfer signal output terminal ST(N) of the N-th stage GOA unit and inputted with the clock signal CK. The pull-high unit comprises a thin film transistor T41. A gate of the thin film transistor T41 is connected with a gate signal output terminal D(N+4) of the (N+4)th stage GOA unit. A source electrode and a drain electrode of the thin film transistor T41 are respectively connected with the node Q(N) of the N-th stage GOA unit and the constant-low-voltage signal VSS1.

According to the present invention and the inventive points, there are many embodiments, and the above embodiment exemplifies the simplest GOA circuit, reduces the number of TFTs in the inverter 200 without affecting the output effect, reduces the layout space, and contributes to the narrow border design of the GOA product. Other embodiments derived from the present invention should also be within the scope of protection. It will be appreciated by those skilled in the art that although in the preferred embodiment the pull-high control unit receives the stage-transfer signal and the row scanning signal of the (N−4)th stage GOA unit as control signals, the pull-down unit receives the (N+4)th stage GOA unit of the row scanning signal as control signals. However, the pull-high control unit, the pull-down unit and the pull-high unit can be designed according to the specific application changes. For example, the thin film transistor T11 in the pull-high control unit may have its gate electrode connected to the output terminal of the (N−m)th stage GOA unit, the source electrode and the drain electrode of the thin film transistor T11 are respectively connected with the node Q (N) of the N-th order GOA unit and the gate signal output terminal G(N) of the (m−n)th stage GOA unit. The pull-down unit comprises a thin film transistor T41 whose gate electrode can be connected with the gate signal output terminal of the (N+m)th stage GOA unit, the source electrode and the drain electrode of the thin film transistor T41 are respectively connected with the node Q (N) of the N-th stage GOA unit and inputted with the constant-low-voltage signal VSS1.

By applying the GOA circuit of the present invention to a liquid crystal display device, it is advantageous to realize a narrow frame design of a liquid crystal display device.

Figure 4:
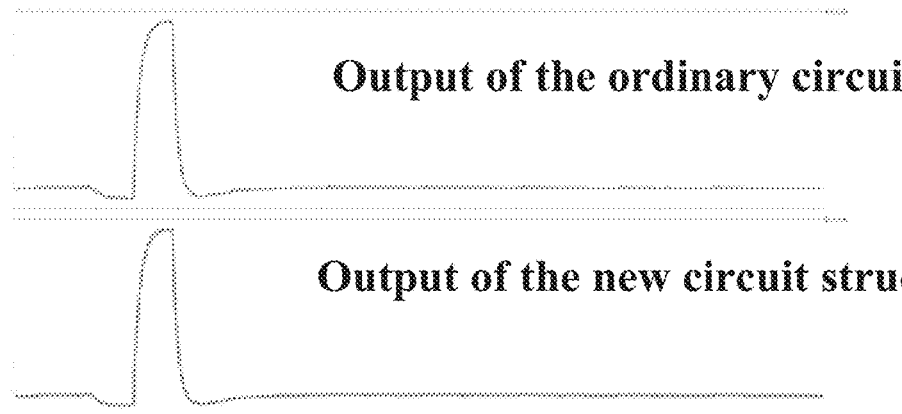
FIG. 4 is a contrast illustrative diagram of a waveform of the output of the circuit architectures with respect to the present invention and the conventional art.

Refer to FIG. 4, which is a contrast illustrative diagram of a waveform of the output of the circuit architectures with respect to the present invention and the conventional art. Wherein the horizontal axis represents time and the vertical axis represents the voltage. The new GOA circuit structure of the present invention has substantially no deterioration in the output of the gate signal output terminal G(N) as compared with the conventional GOA circuit structure on the basis of reducing a TFT.

To sum up, the GOA circuit and the liquid crystal display device of the present invention reduce the number of TFTs and reduce the layout space, which are beneficial for the narrow frame design of GOA circuit product.

As mentioned above, those of ordinary skill in the art, without departing from the spirit and scope of the present invention, can make various kinds of modifications and variations to the present invention. Therefore, all such modifications and variations are intended to be included in the protection scope of the appended claims of the present invention.

What is claimed is:

1. A liquid crystal display device, comprising a GOA circuit, which comprises a plurality of cascaded GOA units, and multiple horizontal scanning lines respectively corresponding to and connected to the plurality of cascaded GOA units of the GOA circuit, wherein a N-th stage GOA unit of the plurality of cascaded GOA units controls charging of a N-th horizontal scanning line of the multiple horizontal scanning lines, wherein the N-th stage GOA unit comprises a pull-high control unit, a pull-high unit, a pull-down unit, a pull-down sustain unit, and a boast capacitor; the pull-high unit, the pull-down sustain unit and the boast capacitor are respectively connected with a first node and a gate signal output terminal of the N-th stage GOA unit, and the pull-high control unit and the pull-down unit are respectively connected with the first node of the N-th stage GOA unit;

wherein the pull-down sustain unit comprises:
a first thin film transistor, a gate electrode of first thin film transistor being inputted with a low frequency clock signal, a source electrode and a drain electrode of first thin film transistor being respectively connected with a second node of the N-th stage GOA unit and inputted with the low frequency clock signal;
a second thin film transistor, a gate electrode of the second thin film transistor being connected with the first node of the N-th stage GOA unit, a source electrode and a drain electrode of the second thin film transistor being respectively connected with the second node of the N-th stage GOA unit and inputted with a constant-low-voltage signal;
a third thin film transistor, a gate electrode of the third thin film transistor being connected with a stage-transfer signal output terminal of the N-th stage GOA unit, a source electrode and a drain electrode of the third thin film transistor being respectively connected with the second node of the N-th stage GOA unit and inputted with the constant-low-voltage signal;
a fourth thin film transistor, a gate of the fourth thin film transistor being connected with the second node of the N-th stage GOA unit, a source electrode and a drain electrode of the fourth thin film transistor being respectively connected with the first node of the N-th stage GOA unit and inputted with the constant-low-voltage signal; and
a fifth thin film transistor, a gate electrode of the fifth thin film transistor being connected with the second node of the N-th stage GOA unit, a source electrode and a drain electrode of the fifth thin film transistor being respectively connected with the gate signal output terminal of the N-th stage GOA unit and inputted with the constant-low-voltage signal.

2. The liquid crystal display device according to claim 1, wherein the pull-high control unit comprises a sixth thin film transistor, a gate of the sixth thin film transistor is connected with a stage-transfer signal output terminal of the (N−m)th stage GOA unit, a source electrode and a drain electrode of the sixth thin film transistor are respectively connected with the first node of the N-th stage GOA unit and a gate signal output terminal of the (N−m)th stage GOA unit, and in is a natural number.

3. The liquid crystal display device according to claim 2, wherein the gate of the sixth thin film transistor is connected with a stage-transfer output terminal of the (N−4)th stage GOA unit, the source electrode and the drain electrode of the sixth thin film transistor are respectively connected with the first node of the N-th stage GOA unit and a gate signal output terminal of the (N−4)th stage GOA unit.

4. The liquid crystal display device according to claim 2, wherein the pull-high unit comprises a ninth thin film transistor, a gate of the ninth thin film transistor is connected with a gate signal output terminal of the (N+m)th stage GOA unit, a source electrode and a drain electrode of the ninth thin film transistor are respectively connected with the first node of the N-th stage GOA unit and the constant-low-voltage signal.

5. The liquid crystal display device according to claim 4, wherein the gate of the ninth thin film transistor is connected with a gate signal output terminal of the (N+4)th stage GOA unit, the source electrode and the drain electrode of the ninth thin film transistor are respectively connected with the first node of the N-th stage GOA unit and the constant-low-voltage signal.

6. The liquid crystal display device according to claim 1, wherein the pull-high unit comprises:
a seventh thin film transistor, a gate electrode of the seventh thin film transistor is connected with the first node of the N-th stage GOA unit, a source electrode and a drain electrode of the seventh thin film transistor are respectively connected with the gate signal output terminal of the N-th stage GOA unit and inputted with a clock signal;

an eighth thin film transistor, a gate electrode of the eighth thin film transistor is connected with the first node of the N-th stage GOA unit, a source electrode and a drain electrode of the eighth thin film transistor are respectively connected with the stage-transfer signal output terminal of the N-th stage GOA unit and inputted with the clock signal.

7. The liquid crystal display device according to claim 1, wherein the low frequency clock signal is a constant-high-voltage signal.

8. A liquid crystal display device, comprising a GOA circuit, which comprises a plurality of cascaded GOA units, and multiple horizontal scanning lines respectively corresponding to and connected to the plurality of cascaded GOA units of the GOA circuit, wherein a N-th stage GOA unit of the plurality of cascaded GOA units controls charging of a N-th horizontal scanning line of the multiple horizontal scanning lines, wherein the N-th stage GOA unit comprises a pull-high control unit, a pull-high unit, a pull-down unit, a pull-down sustain unit, and a boast capacitor; the pull-high unit, the pull-down sustain unit and the boast capacitor are respectively connected with a first node and a gate signal output terminal of the N-th stage GOA unit, and the pull-high control unit and the pull-down unit are respectively connected with the first node of the N-th stage GOA unit;

wherein the pull-down sustain unit comprises:

a first thin film transistor, a gate electrode of first thin film transistor being inputted with a low frequency clock signal, a source electrode and a drain electrode of first thin film transistor being respectively connected with a second node of the N-th stage GOA unit and inputted with the low frequency clock signal;

a second thin film transistor, a gate electrode of the second thin film transistor being connected with the first node of the N-th stage GOA unit, a source electrode and a drain electrode of the second thin film transistor being respectively connected with the second node of the N-th stage GOA unit and inputted with a constant-low-voltage signal;

a third thin film transistor, a gate electrode of the third thin film transistor being connected with a stage-transfer signal output terminal of the N-th stage GOA unit, a source electrode and a drain electrode of the third thin film transistor being respectively connected with the second node of the N-th stage GOA unit and inputted with the constant-low-voltage signal;

a fourth thin film transistor, a gate of the fourth thin film transistor being connected with the second node of the N-th stage GOA unit, a source electrode and a drain electrode of the fourth thin film transistor being respectively connected with the first node of the N-th stage GOA unit and inputted with the constant-low-voltage signal; and a fifth thin film transistor, a gate electrode of the fifth thin film transistor being connected with the second node of the N-th stage GOA unit, a source electrode and a drain electrode of the fifth thin film transistor being respectively connected with the gate signal output terminal of the N-th stage GOA unit and inputted with the constant-low-voltage signal;

wherein the pull-high control unit comprises a sixth thin film transistor, a gate of the sixth thin film transistor is connected with a stage-transfer signal output terminal of the (N−m)th stage GOA unit, a source electrode and a drain electrode of the sixth thin film transistor are respectively connected with the first node of the N-th stage GOA unit and a gate signal output terminal of the (N−m)th stage GOA unit, and in is a natural number;

wherein the pull-high unit comprises:

a seventh thin film transistor, a gate electrode of the seventh thin film transistor is connected with the first node of the N-th stage GOA unit, a source electrode and a drain electrode of the seventh thin film transistor are respectively connected with the gate signal output terminal of the N-th stage GOA unit and inputted with a clock signal;

an eighth thin film transistor, a gate electrode of the eighth thin film transistor is connected with the first node of the N-th stage GOA unit, a source electrode and a drain electrode of the eighth thin film transistor are respectively connected with the stage-transfer signal output terminal of the N-th stage GOA unit and inputted with the clock signal;

wherein the pull-high unit comprises a ninth thin film transistor, a gate of the ninth thin film transistor is connected with a gate signal output terminal of the (N+m)th stage GOA unit, a source electrode and a drain electrode of the ninth thin film transistor are respectively connected with the first node of the N-th stage GOA unit and the constant-low-voltage signal; and wherein the low frequency clock signal is a constant-high-voltage signal.

9. The liquid crystal display device according to claim 8, wherein the gate of the sixth thin film transistor is connected with a stage-transfer output terminal of the (N−4)th stage GOA unit, the source electrode and the drain electrode of the sixth thin film transistor are respectively connected with the first node of the N-th stage GOA unit and a gate signal output terminal of the (N−4)th stage GOA unit.

10. The liquid crystal display device according to claim 8, wherein the gate of the ninth thin film transistor is connected with a gate signal output terminal of the (N+4)th stage GOA unit, the source electrode and the drain electrode of the ninth thin film transistor are respectively connected with the first node of the N-th stage GOA unit and the constant-low-voltage signal.

* * * * *